(12) United States Patent
Kanaya et al.

(10) Patent No.: US 11,335,841 B2
(45) Date of Patent: May 17, 2022

(54) LED MODULE AND METHOD FOR MANUFACTURING LED MODULE

(71) Applicant: Japan Display Inc., Tokyo (JP)

(72) Inventors: Yasuhiro Kanaya, Tokyo (JP); Gen Koide, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/001,703

(22) Filed: Aug. 25, 2020

(65) Prior Publication Data
US 2021/0066557 A1 Mar. 4, 2021

(30) Foreign Application Priority Data

Aug. 29, 2019 (JP) .............................. JP2019-156806

(51) Int. Cl.
*H01L 33/60* (2010.01)
*H01L 33/62* (2010.01)
*H01L 27/15* (2006.01)
*G09F 9/33* (2006.01)

(52) U.S. Cl.
CPC ...... *H01L 33/60* (2013.01); *H01L 2933/0058* (2013.01)

(58) Field of Classification Search
CPC ........ H01L 33/60; H01L 33/38; H01L 27/156
See application file for complete search history.

(56) References Cited

U.S. PATENT DOCUMENTS

| 2012/0056229 A1* | 3/2012 | Hsu ..................... H01L 33/58 257/98 |
| 2014/0160750 A1* | 6/2014 | Liu .................... G02B 19/0019 362/235 |
| 2019/0075633 A1 | 3/2019 | Tsai et al. |

\* cited by examiner

*Primary Examiner* — Marcos D. Pizarro
*Assistant Examiner* — Antonio B Crite
(74) *Attorney, Agent, or Firm* — Xsensus LLP

(57) ABSTRACT

An LED module includes a first metal layer disposed on a base surface and an LED chip disposed on the first metal layer. The first metal layer includes a first end portion forming a contour away from the base surface, and a curved portion between a region overlapping the LED chip and the first end portion.

16 Claims, 15 Drawing Sheets

LED MODULE AND METHOD FOR MANUFACTURING LED MODULE

CROSS-REFERENCE TO RELATED APPLICATIONS

This application is based upon and claims the benefit of priority from the prior Japanese Patent Application No. 2019-156806, filed on Aug. 29, 2019, the entire contents of which are incorporated herein by reference.

FIELD

An embodiment of the present disclosure relates to an LED module on which an LED (Light Emitting Diode) chip is mounted and a display device including structures of the LED module, and methods of manufacturing the same.

BACKGROUND

Micro LED displays are known in which microscopic light emitting diodes, called micro LEDs, are mounted on pixels arranged in a matrix. Micro LED displays are common to organic EL displays using organic electroluminescent devices in that the pixels are self-luminous. However, while organic EL displays directly form organic electroluminescent devices on a substrate called a backplane on which thin-film transistors (TFTs: Thin Film Transistor) are formed, micro-LED displays are different in that LED chips fabricated on different substrate are mounted on the backplane.

SUMMARY

An LED module in an embodiment according to the present invention includes a first metal layer disposed on a base surface and an LED chip disposed on the first metal layer. The first metal layer includes a first end portion forming a contour away from the base surface, and a curved portion between a region overlapping the LED chip and the first end portion.

A method for manufacturing LED module in an embodiment according to the present invention, the method includes forming a first metal layer having a first end portion forming a contour on a base surface, performing heat treatment on the first metal layer, and mounting an LED chip on the first metal layer. The heat treatment forms a curved portion in the first metal layer, and the curved portion forms a shape in which the first end portion is away from the base surface.

DESCRIPTION OF EMBODIMENTS

Figure 1A:
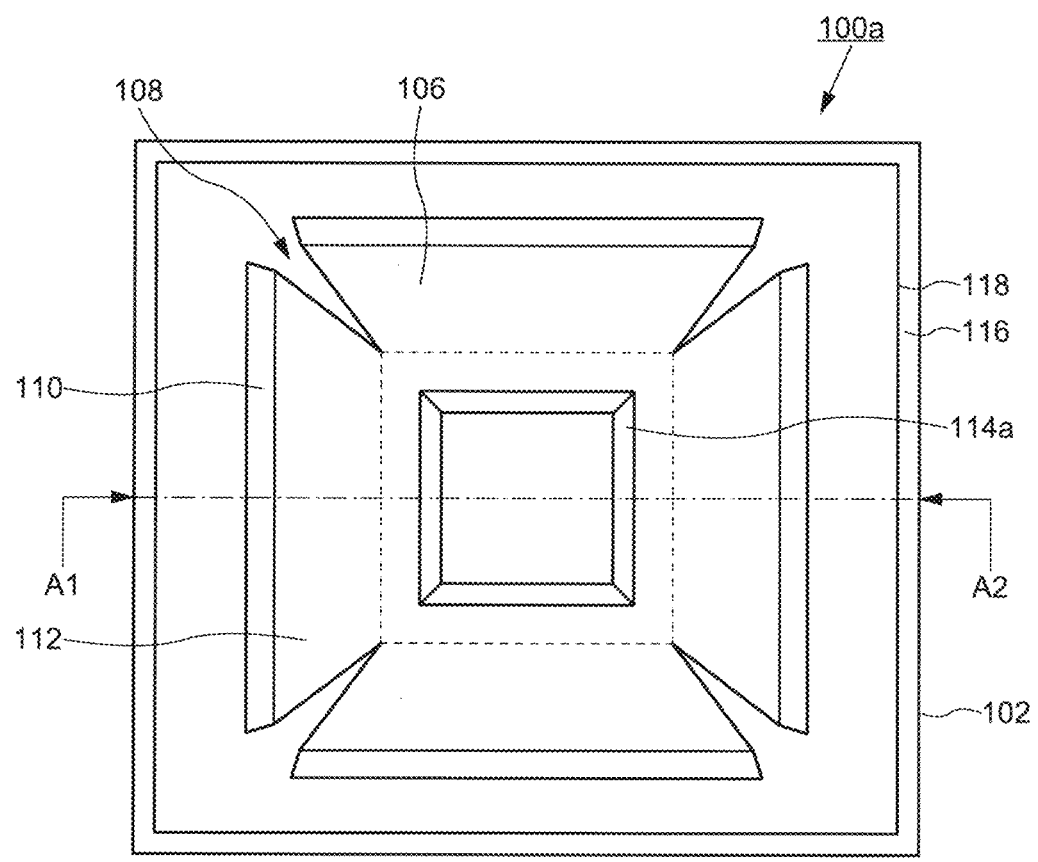
FIG. 1A shows a plan view of an LED module according to an embodiment of the present disclosure.

Embodiments of the present invention will be described below with reference to the drawings and the like. However, the present invention may be practiced in many ways and is not to be construed as being limited to the description of the embodiments illustrated below. In order to make the explanation clearer, the drawing may schematically show the width, thickness, shape, etc. of each part in comparison with the actual embodiment. However, it is an example and is not intended to limit the interpretation of the present invention. In this specification and each figure, elements similar to those described above with respect to the previously described figures are denoted by the same reference numerals (or a number followed by a, b, etc.) and detailed description thereof may be omitted as appropriate. In addition, the letters "First" and "Second" appended to each element are expedient signs used to distinguish between the elements and have no further meaning unless otherwise stated.

In this specification, when a member or region is "Up (or Below)" of another member or region, unless otherwise specified, this includes not only a case where it is directly above (or directly below) another member or region but also a case where it is above (or lower) another member or region. That is, it includes the case where another component is included in between above (or lower) another member or region. In the following description, unless otherwise specified, the side on which the touch sensor is provided with respect to the base member may be referred to as "Up" or "Up" in a cross-sectional view. Also, the side seen from the or the "Up" is described as "Top" or "Top Side" and the reverse is described as, "Down", "Underside" or "Bottom side".

In one embodiment of the present invention, the micro LED means a micro LED having a chip size of not less than several micrometers and not more than 100 μm, and the mini LED means a micro LED having a chip size of not less than 100 μm. One embodiment of the present invention can use any size of LEDs and can be used separately depending on the pixel size of the LED module and display device.

First Embodiment

Figure 1B:
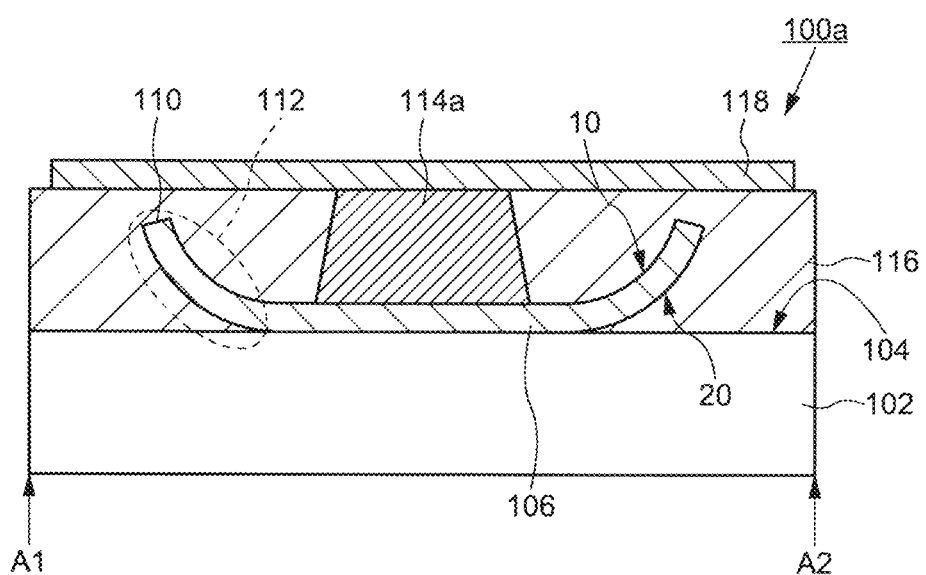
FIG. 1B shows a cross-sectional view of an LED module according to an embodiment of the present disclosure.

FIG. 1A and FIG. 1B show a configuration of an LED module 100a according to an embodiment of the present disclosure. FIG. 1A shows plan view of the LED module 100a, and the cross-sectional structures corresponding to A1-A2 line shown in FIG. 1A are shown in FIG. 1B. In the following description, reference will be made to both of these drawings as appropriate.

The LED module 100a have a structure in which a first metal layer 106, an LED chip 114a, and a transparent conductive layer 118 are stacked on a substrate 102. The LED chip 114a is disposed on the first metal layer 106, also referred to as a pedestal metal layer, and the transparent conductive layer 118 is disposed on the LED chip 114a. An insulating layer 116 may be provided between the first metal layer 106 and the transparent conductive layer 118 so as to bury the LED chip 114a.

As the substrate 102, a glass substrate, a ceramics substrate, a plastic substrate, a plastic film having a flexibility, a metallic substrate, or the like is used. Although not shown in FIG. 1B, circuits for controlling light emission of the LED chip 114a may be provided between the substrate 102 and the first metal layer 106. For example, a circuit formed of a thin film transistor which is electrically connected to the LED chip 114a may be provided between the substrate 102 and the first metal layer 106.

The first metal layer 106 is provided on the upper surface of the substrate 102. In planar view, the first metal layer 106 is formed in a predetermined geometry. For example, the first metal layer 106 may have a rectangular shape, a polygonal shape having a larger number of angles than the rectangular shape, or a circular shape. Such a first metal layer 106, at least one place of notch portion 108 from the outer end toward the inside may be formed. For example, as shown in FIG. 1A, the first metal layer 106 is formed in a square shape, it may have a shape in which notch portion 108 is formed on the four-corner portion.

As shown in FIG. 1B, the first metal layer 106 in cross-sectional view has a region in contact with a base surface 104 and a region away from the base surface 104. That is, the first metal layer 106 contacts the base surface 104 in a region that overlaps the LED chip 114a, and a first end portion 110 that forms the outline has structures distant from the base surface 104. In other words, the first metal layer 106 has a structure in which the contoured first end portion 110 floats away from the base surface 104. The first metal layer 106 then contains a curved portion 112 from region to the first end portion 110 that overlaps the LED chip 114a.

The base surface 104 is a surface corresponding to the base of the first metal layer 106. If the first metal layer 106 is formed of thin film, the base surface 104 is the surface to be formed of thin film. Further, when the first metal layer 106 is formed of a metal foil, the base surface 104 is an adhered surface of the metal foil. When the substrate 102 side of the first metal layer 106 is the first surface 10 and its back surface side is the second surface 20, the base surface 104 is a surface closest to the first surface 10 of the first metal layer except for the aforementioned curved part.

The height of the first end portion 110 of the first metal layer 106 is higher than the inferior aspect of the LED chip 114a and lower than the superior aspect. In other words, the first end portion 110 of the first metal layer 106 is located between the lower surface and the upper surface of the LED chip. The first end portion 110 of the first metal layer 106 may be positioned in such a position to prevent it from contacting transparent conductive layer. The curved portion 112 of the first metal layer 106 preferably has a continuous curved surface shape such that the height gradually increases toward the upper surface.

The curved portion 112 preferably has a shape surrounding the entire circumference of the LED chip 114a. The first metal layer 106 by having a notch portion 108, it is easy to form a uniform curved portion 112 so as to surround the outside of the LED chip 114a. However, when the curved portion 112 is formed spontaneously by the internal stress of the first metal layer 106, notch portion 108 is not necessarily required. Further, in the manufacturing process, when the curved portion 112 is formed so that the first end portion 110 is floated from the base surface 104 by the thermal stress acts on the first metal layer 106, notch portion 108 may be omitted.

The curved portion 112 of the first metal layer 106 is used as a reflective surface, as will be described later. If the curved portion 112 has a shape that surrounds the LED chip 114a over the entire circumference, the directivity of the light emitted from the LED chip 114a can be enhanced. In order to increase the directivity of the emitted light, the first metal layer 106 is preferably formed of a metal material having a high reflectance. For example, the first metal layer 106 is preferably formed of a metal material selected from at least one of aluminum (Al), copper (Cu), and silver (Ag).

The LED chip 114a is a 2-terminal type device with a pair of electrodes called anode or p-type side electrode, cathode or n-type side electrode. For example, the LED chip 114a has a structure in which an anode is provided on a first surface and a cathode is provided on a second surface 20 opposite to the first surface. The shape of the LED chip 114a is arbitrary and has, for example, a shape such as a cube, rectangular body, quadrangular petrous table.

Figure 2:
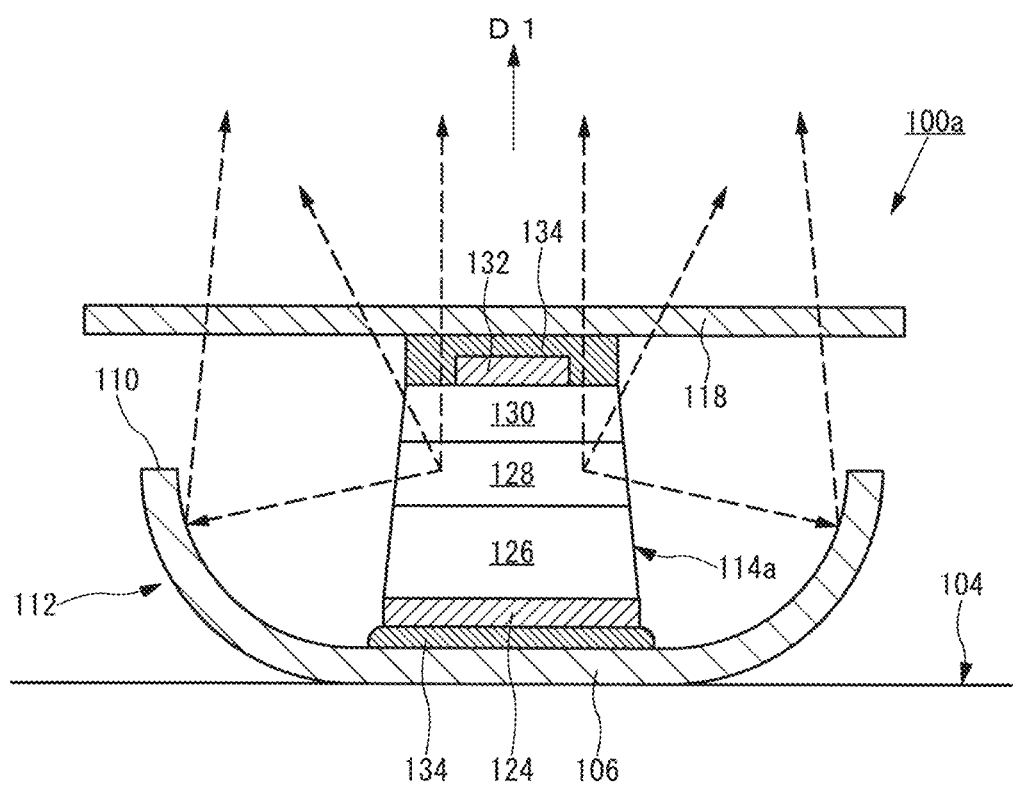
FIG. 2 shows the configuration of an LED module according to an embodiment of the present invention, showing the detailed construction of the LED chip and the first metal layer and transparent conductive layer are connected.

FIG. 2 shows a connecting structure of a vertically structured LED chip 114a in which a pair of electrodes sandwich an emitting layer. The LED chip 114a has a structure in which an n-type layer 126, an emitting layer 128, and a p-type layer 130 are stacked. The LED chip 114a is formed in a semiconductor wafer such as GaAs not shown, on which an n-type layer 126 formed in a compound semiconductor of the gallium nitride system is formed through a buffer layer not shown. The emitting layer 128, a quantum-well structure is formed by a gallium nitride-based compound semiconductor, p-type layer 130 is formed by a gallium nitride-based compound semiconductor. An n-type side electrode 124 is provided on the n-type layer 126 side, a p-type side electrode 132 is provided on the p-type layer 130 side. The LED chip 114a is electrically connected with the first metal layer 106 by the n-type side electrode 124 and a conductive member 134 such as conductive paste or solder, with the p-type side electrode 132 in direct contact with the transparent conductive layer 118.

The LED chip 114a emits light from the emitting layer 128 when a voltage greater than or equal to the emission threshold voltage is applied between the first metal layer 106 and the transparent conductive layer 118. Light emitted from the LED chip 114a has a weak directivity and is emitted not only to the front side (direction D1 shown in FIG. 2) but also to transverse direction with a wide solid angle. Since the LED chip 114a have such light emitting characteristics, the LED module 100a according to the present embodiment can reflect light emitted to transverse direction in the direction D1 by providing the first end portion 110 of the first metal layer 106 away from the base surface 104 and having the curved portion 112. By such an action, the LED module 100a can improve the directivity of the light emitted from the LED chip 114a and can effectively utilize the light.

FIG. 2 shows a configuration in which the n-type side electrode 124 is electrically connected to the first metal layer 106 and the p-type side electrode 132 is connected to the transparent conductive layer 118. However, the LED module 100a according to the present embodiment is not limited to this structure and may have an opposite connection structure. That is, the p-type side electrode 132 is electrically connected to the first metal layer 106, the n-type side electrode 124 may have a configuration that is connected to the transparent conductive layer 118.

As shown in FIG. 1B, the first metal layer 106 and the LED chip 114*a* are embedded in the insulating layer 116. The first end portion 110 and the curved portion 112 of the first metal layer 106 are away from the base surface 104, so that both surfaces of the first surface 10 and the second surface 20 are in contact with the insulating layer 116. Thus, since the first metal layer 106 is embedded in the insulating layer 116 even if the first end portion 110 and the curved portion 112 have a shape away from the base surface 104, it is possible to maintain the stability of the shape.

The insulating layer 116 preferably includes light transmittance and is formed of insulating resinous materials such as acrylics, polyimides, epoxies, and silicones. The insulating layer 116 is formed by coating a resin composition containing a precursor of an insulating resin material such as acrylic, polyimide, or epoxy, and curing the resin composition by applying thermal energy or light energy. The resin composition has flowability. After the resin composition is applied, the curved portion 112 of the first metal layer 106 can be embedded by standing (leveling) for a predetermined time before the curing treatment. That is, the upper surface of the insulating layer 116 can be planarized. Thus, the insulating layer 116 has a function as a planarization film. Further, by not projecting the first end portion 110 of the first metal layer 106 above the top surface of the LED chip 114*a* can be so as not to contact the transparent conductive layer 118.

The insulating layer 116 is provided so as to expose an upper surface of the LED chip 114*a*, more specifically, the p-type electrode 132 shown in FIG. 2. The transparent conductive layer 118 is provided on the insulating layer 116 and is formed so as to be electrically connected to the LED chip 114*a*.

The LED module 100*a* according to the present embodiment has a structure in which the curved portion 112 is provided in a first metal layer 106 which is electrically connected to one electrode (n-type side electrode or p-type side electrode) of the LED chip 114*a*. The first metal layer 106 is used not only as an electrode but also as a light reflecting surface. Since the first metal layer 106 is provided with the curved portion 112 so as to function as a light reflecting surface, the directivity of the light emitted from the LED chip 114*a* can be enhanced.

Second Embodiment

A method of manufacturing the LED module 100*a* according to an embodiment of the present invention will be described. FIGS. 3A to 3D shows a manufacturing process of the LED module 100*a* according to the present embodiment.

Figure 3A:
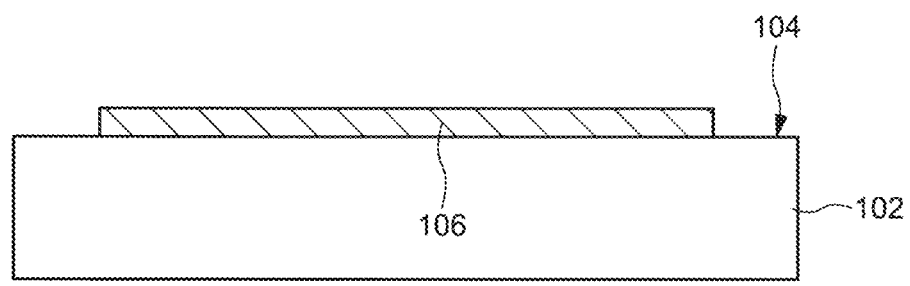
FIGS. 3A to 3D shows the steps of forming the first metal layers in the manufacturing process of the LED module according to an embodiment of the present disclosure.

As shown in FIG. 3A, a first metal layer 106 is formed on the substrate 102. The first metal layer 106 is formed in contact with the base surface 104. The first metal layer 106 is prepared by using a thin film fabrication technique such as a sputtering method, a vacuum deposition method (electron-beam deposition method). For example, the first metal layer 106 is formed by a sputtering method using a target of a metal selected from at least one of aluminum (Al), copper (Cu), and silver (Ag). According to such a thin film manufacturing technique, since the metal film is formed on the entire surface of the substrate 102, the first metal layer 106 is formed into a mask pattern by a process such as photolithography after the metal film is formed, and is formed into a predetermined shape (e.g., a rectangular shape) by etching.

In the process of processing the metallic film, notch portion 108 as shown in FIG. 1A may be formed at the same time.

Figure 3B:
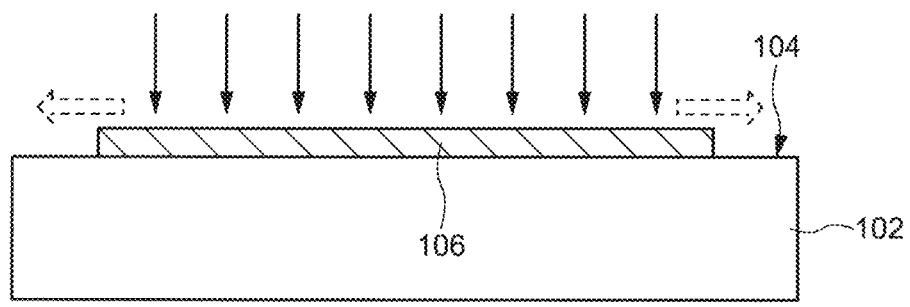

Next, as shown in FIG. 3B, the first metal layer 106 is heated. The first metal layer 106 expands upon heating, and a force (a force that tries to slip) stretching and spreading on the base surface 104 acts on the interface with the base surface 104. On the other hand, since the thermal expansion coefficient between the first metal layer 106 and the substrate 102 is different, a thermal stress is generated between them. Such a thermodynamic phenomenon becomes remarkable when, for example, the first metal layer 106 is subjected to a treatment for instantaneously heating by laser annealing or flash lamp annealing.

Figure 3C:
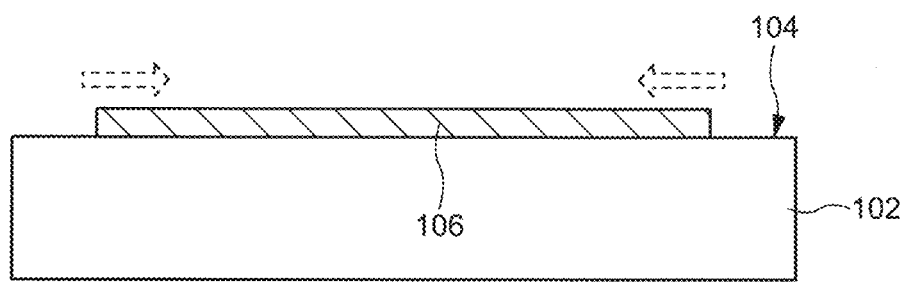
Figure 3D:
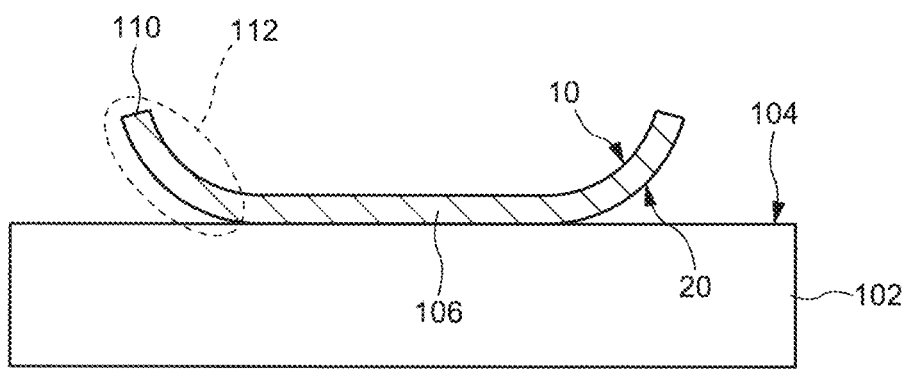

FIG. 3C shows the cooling process after heating of the first metal layer 106. In the cooling process, the first metal layer 106 exerts a force that tends to return from the extended state to the original state on the base surface 104. With such a thermal history, as shown in FIG. 3D, the first metal layer 106 can be shaped to peel from the first end portion 110 to form the curved portion 112. The height of the first end portion 110 due to curvature of the first metal layer 106 is formed to be higher than the lower surface of the LED chip 114*a* and lower than the upper surface.

The above-described deformation processing of the first metal layer 106 by heating and subsequent cooling can be performed more effectively by utilizing the internal stress of the first metal layer 106. The inner stresses of the first metal layers 106 can be applied at the stage of film formation shown in FIG. 3A. The first metal layer 106 to have a tensile stress can be realized by adjusting the deposition conditions. For example, during film formation by sputtering, so as to include a sputtering gas such as argon (Ar) in the film, then, by releasing argon contained in the film by heat treatment (Ar), it is possible to impart a tensile stress to the first metal layer 106.

After forming the curved portion 112 in the first metal layer 106, the LED chip 114*a* can be implemented, implanted with the insulating layer 116, and form the transparent conductive layer 118 to create the LED module 100*a* as shown in FIG. 1B.

According to the present embodiment, the first metal layer 106 provided as the pedestal of the LED chip 114*a* is partially peeled off by heat treatment, and the curved portion 112 used as the light reflecting surface can be formed. According to the manufacturing process shown in this embodiment, it is possible to form the first metal layer 106 having the curved portion 112 which can be used as the light reflecting surface only by controlling the heating and cooling processes without requiring a complicated process or an additional process. As a result, the productivity of the LED module 100*a* having high directivity of emitted light can be increased.

Third Embodiment

This embodiment shows a manufacturing method of the LED module 100*a* different from the second embodiment. Hereinafter, portions different from those of the second embodiment will be described.

Figure 4A:
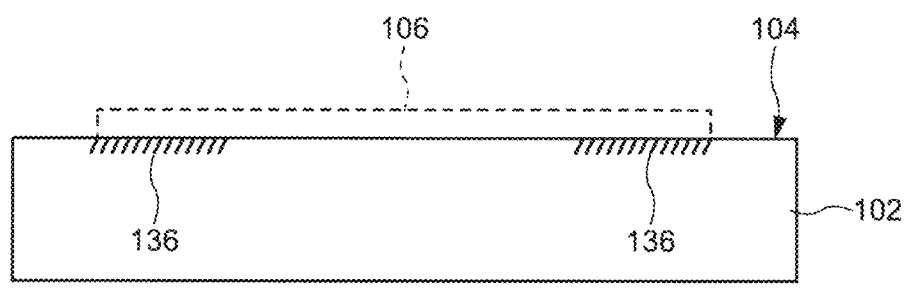
FIGS. 4A to 4D shows the steps of forming the first metal layer in the manufacturing process of the LED module according to an embodiment of the present disclosure.

FIGS. 4A to 4D show methods of manufacturing the LED module 100*a* according to the present embodiment. FIG. 4A shows the step of forming a region on the base surface 104 that differs in the adhesion of the metallic film. Specifically, a liquid-repellent region 136 is selectively formed on the base surface 104. The liquid-repellent region 136 is formed in accordance with region at which the first metal layer 106 is peeled to form the curved portion 112. The liquid-repellent region 136 can be formed by, for example, fluorine-plasma treatment when the base surface 104 is inorganic insulating film. In addition, by forming fluorine resin film as the base surface 104 and laser-treating region other than the liquid-repellent region 136 shown in FIG. 4A to form a lyophilic surface, a region having a metallic film with differing adhesiveness can be formed.

FIG. 4A shows an embodiment in which the liquid repellent-region 136 is formed in accordance with region in which the metal film is peeled off, but conversely, a lyophilic region may be formed in accordance with region in which the metal film is brought into close contact with each other. In any case, in the present embodiment, the first metal layer 106 is peeled off to form the curved portion 112 region, the step of performing the pretreatment of the base surface 104 so that the adhesion force differs between region to adhere is included.

Figure 4B:
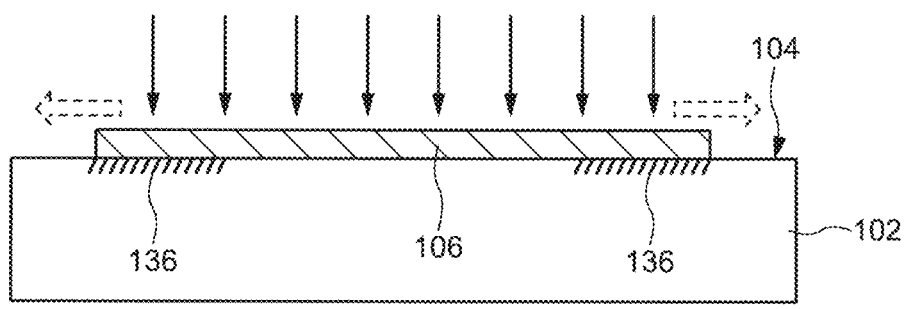
Figure 4C:
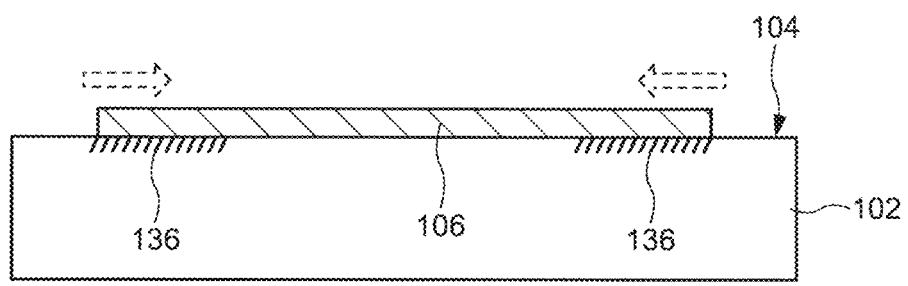
Figure 4D:
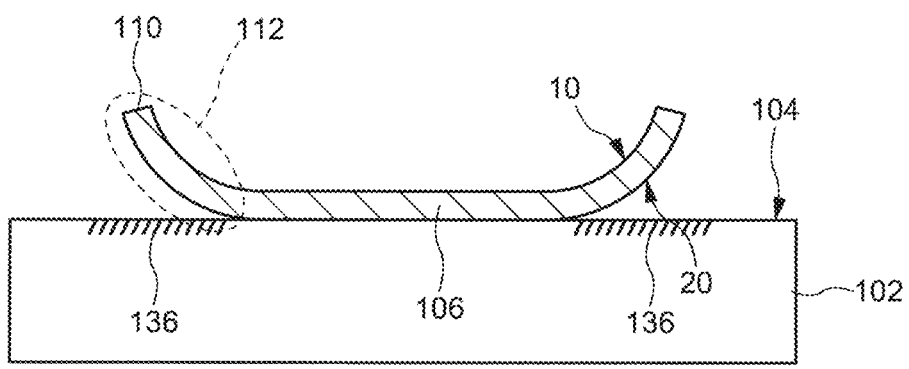

Thereafter, the first metal layer 106 is formed by sputtering or the like, as shown in FIG. 4B, subjected to a process of heating the first metal layer 106, by passing through the cooling step as shown in FIG. 4C. As shown in FIG. 4D, the curved portion 112 it is possible to form a first metal layer 106 having.

According to the present embodiment, by the surface condition of the base surface 104 of the first metal layer 106 is controlled and region that the adhesion force of the metal film is reduced is formed. The first metal layer 106 having the curved portion 112 can be more reliably formed, and the LED module 100a can be manufactured using this. In the present embodiment, since the range in which the first metal layer 106 is peeled off can be actively controlled by the adhesion force of the base surface 104, the range and size of the curved portion 112 can be intentionally controlled.

Fourth Embodiment

This embodiment shows an LED module 100b having a different structure of the LED chip with respect to the first embodiment. In the following description, a portion different from the first embodiment will be mainly described.

Figure 5A:
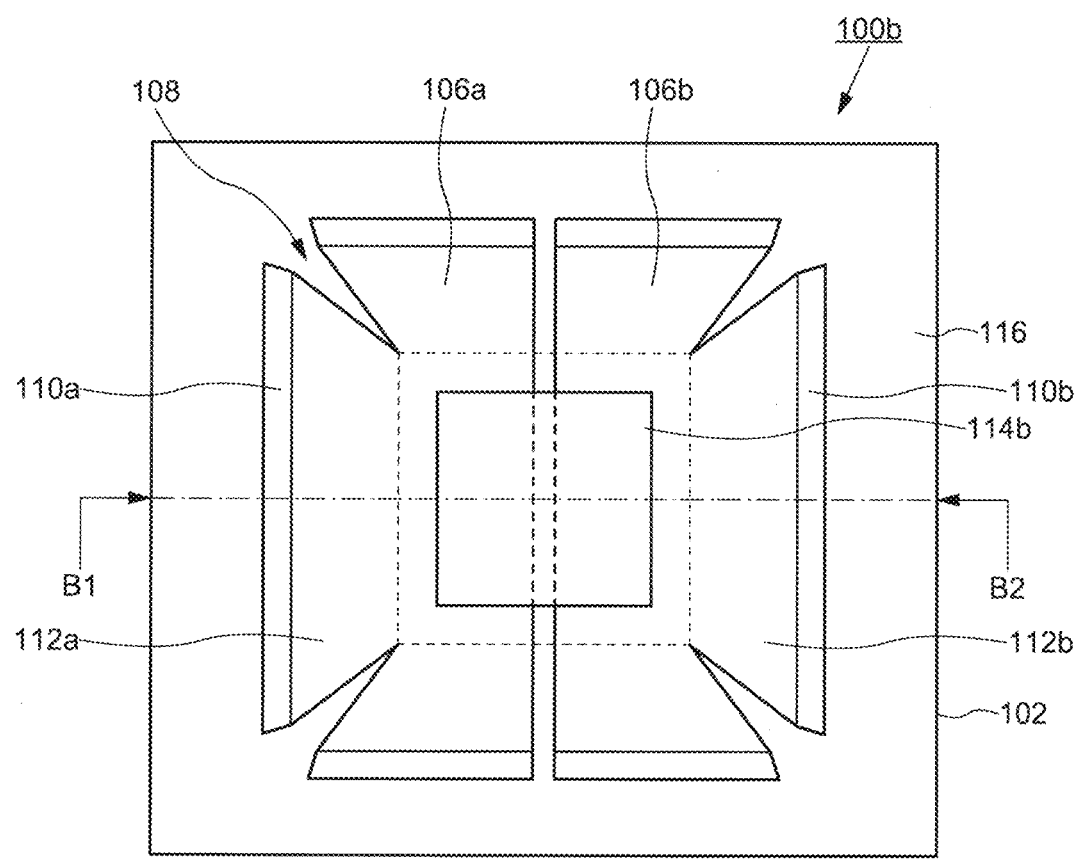
FIG. 5A shows a plan view of an LED module according to an embodiment of the present disclosure.
Figure 5B:
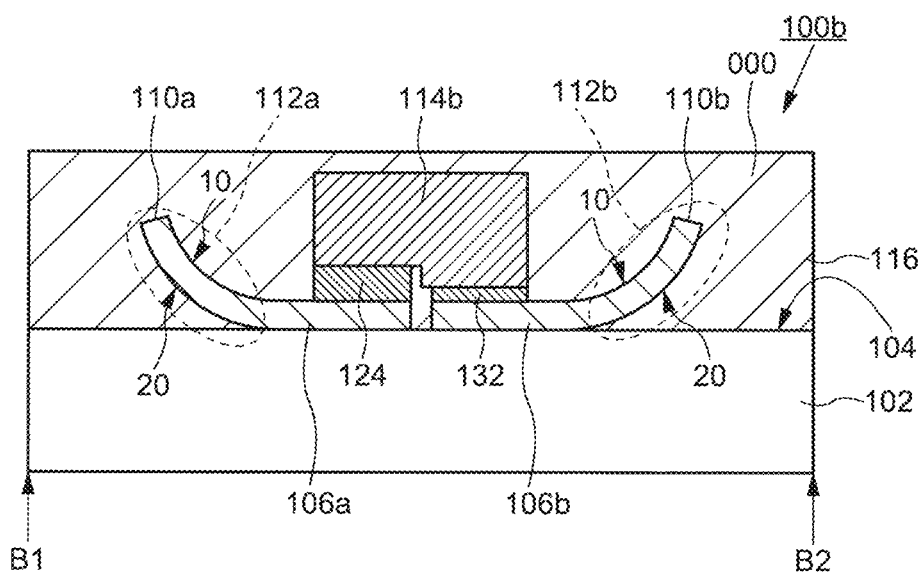
FIG. 5B shows a cross-sectional view of an LED module according to an embodiment of the present disclosure.

FIG. 5A and FIG. 5B show the LED module 100b according to the present embodiment. FIG. 5A shows plan view of the LED module 100b and the cross-sectional structure along B1-B2 line is shown in FIG. 5B.

In the present embodiment, the LED chip 114b has a planar structure in which a pair of electrodes are juxtaposed on one surface side. A first metal layer 106a and a first metal layer 106b as pedestal metal layers are provided below the LED chip 114b. Although the first metal layer 106a and the first metal layer 106b are physically and electrically separated from each other, both of them function as light reflecting surfaces.

The n-type side electrode 124 of the LED chip 114b is electrically connected to the first metal layer 106a, and the p-type side electrode 132 is electrically connected to the first metal layer 106b. The first metal layer 106a has a curved portion 112a, and a first end portion 110a is provided away from the base surface 104. The first metal layer 106b also has a curved portion 112b in the same manner, a first end portion 110b is provided away from the base surface 104. The first metal layer 106a and the second metal layer 120b may have a substantially axisymmetric structure.

The first metal layer 106a, the first metal layer 106b, and the LED chip 114b are embedded in the insulating layer 116 in the same manner as in the first embodiment. Since voltages are applied to the LED chip 114b by the first metal layer 106a and the first metal layer 106b, no transparent conductive layer is provided on the insulating layer 116.

In the present embodiment, the light emitted from the LED chip 114b is the same as the example shown in FIG. 2 in the first embodiment. Also in the LED module 100b according to the present embodiment, since the first metal layer 106a and the first metal layer 106b function as light reflecting surfaces, it is possible to obtain an advantageous effect that the directivity of the light emitted from the LED chip 114b can be enhanced.

Fifth Embodiment

This embodiment shows an example in which the configuration of the first metal layer is different from that of the first embodiment. In the following description, a portion different from the first embodiment will be mainly described.

Figure 6A:
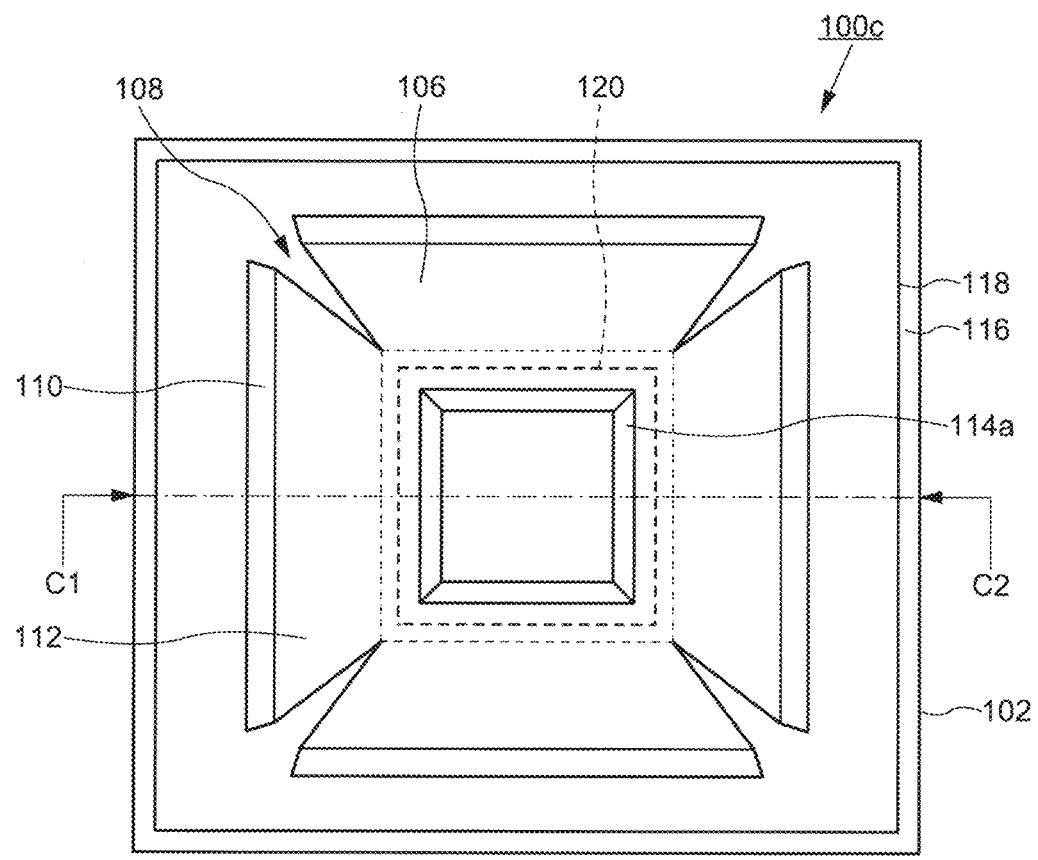
FIG. 6A shows a plan view of an LED module according to an embodiment of the present disclosure.
Figure 6B:
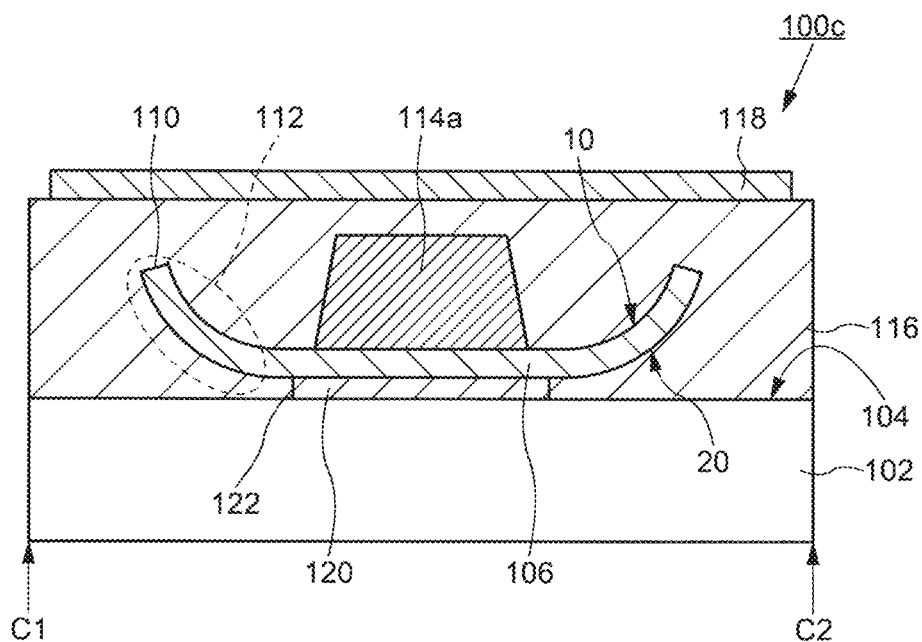
FIG. 6B shows a cross-sectional view of an LED module according to an embodiment of the present disclosure.

FIG. 6A and FIG. 6B show an LED module 100c according to the present embodiment. FIG. 6A shows plan view of the LED module 100c, and the cross-sectional structure along C1-C2 line is shown in FIG. 6B.

The LED module 100c according to the present embodiment includes the second metal layer 120 between the base surface 104 and the first metal layer 106. The second metal layer 120, one surface is in contact with the base surface 104, the other surface is in contact with the first surface 10 of the first metal layer 106. The second metal layer 120 is placed in a region overlapping the LED chip 114a. In planar view, the second metal layer 120 is smaller than the first metal layer 106, and the second end portion 122 forming the profile of the second metal layer 120 is disposed inside the first end portion 110 of the first metal layer 106. More specifically, the second end portion 122 forming the outline of the second metal layer 120 is provided at a position that overlaps the end of the curved portion 112 (the end of the LED chip 114a side) or inside the curved portion 112 of the first metal layer 106.

The second metal layer 120 is formed of a metal material having a higher adhesion to the base surface 104 than the first metal layer 106. Specifically, the first metal layer 106 and the second metal layer 120 are formed of different metal materials. The first metal layer 106 is formed of a metal material selected from at least one of aluminum (Al), copper (Cu), and silver (Ag), while the second metal layer 120 is formed of a metal material selected from at least one of titanium (Ti), molybdenum (Mo), and tungsten (W).

The first metal layer 106 and the second metal layer 120 are used as electrodes for applying a voltage to the LED chip 114a, similarly to the first embodiment. Since the second metal layer 120 has high adhesion to the base surface 104, the LED chip 114a can be reliably mounted on the substrate 102. As a result, the LED chip 114a can be prevented from falling off from the substrate 102. In addition, the first metal layer 106 can reliably form the curved portion 112 because the curved portion 112 does not overlap with the second metal layer 120. In other words, by changing the size of the second metal layer 120 (by changing the position of the second end portion 122), the extent of the curved portion 112 formed in the first metal layer 106 can be adjusted.

Sixth Embodiment

A method of manufacturing the LED module 100c according to an embodiment of the present invention will be described. FIGS. 7A to 7D shows a manufacturing process of the LED module 100c according to the present embodiment.

Figure 7A:
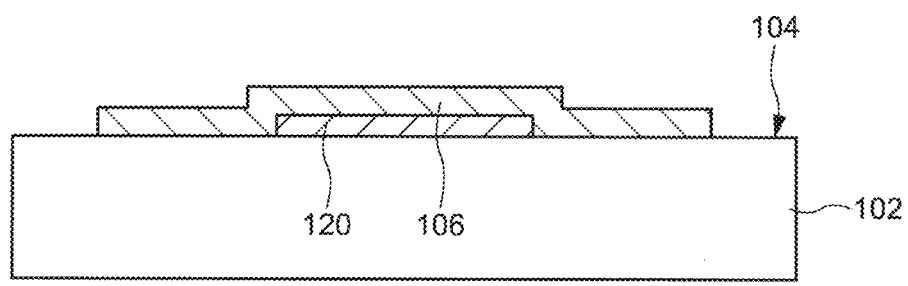
FIGS. 7A to 7D shows the steps of forming the first metal layer in the manufacturing process of the LED module according to an embodiment of the present disclosure.

As shown in FIG. 7A, the second metal layer 120 and the first metal layer 106 are formed on the substrate 102. Specifically, the second metal layer 120 is formed on the substrate 102 first, and then the first metal layer 106 is formed so as to overlap the second metal layer 120. The second metal layer 120 is formed of a metal material selected from at least one of titanium (Ti), molybdenum (Mo), and tungsten (W). The second metal layer 120 is formed by depositing a metal film on the base surface 104 by using a thin film deposition technique such as a sputtering method or a vacuum vapor deposition method (electron beam deposition), and then patterning the film. The first metal layer 106 is formed in the same manner as in the second embodiment.

Figure 7B:
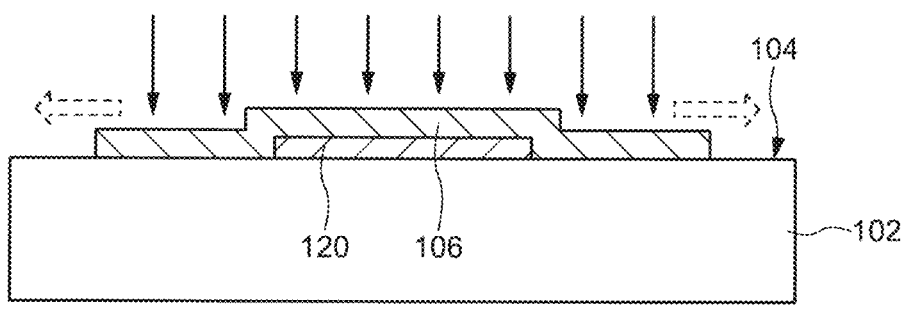

Next, as shown in FIG. 7B, the first metal layer 106 and the second metal layer 120 are heated with region in which the second metal layer 120 and the first metal layer 106 are stacked, and with the first metal layer 106 including region in contact with the base surface 104. The first metal layer 106 expands, stretches, and spreads by heating, and the sliding force acts on the underlying interface. The same applies to the second metal layer 120. However, since the expansion coefficient of the first metal layer 106 is larger than that of the second metal layer 120, the change due to heating appears large. For example, the expansion coefficient of aluminum (Al) as the first metal layer 106 is $23.8 \times 10^{-6}/°$ C., whereas the expansion coefficient of titanium (Ti) selected as the metal material for forming the second metal layer 120 is $8.5 \times 10^{-6}/°$ C., molybdenum (Mo) is $4.9 \times 10^{-6}/°$ C., and tungsten is $4.3 \times 10^{-6}/°$ C. Due to such a difference in expansion coefficient, the first metal layer 106 tends to expand more easily than the second metal layer 120, and a force to stretch by heating appears strongly.

Figure 7C:
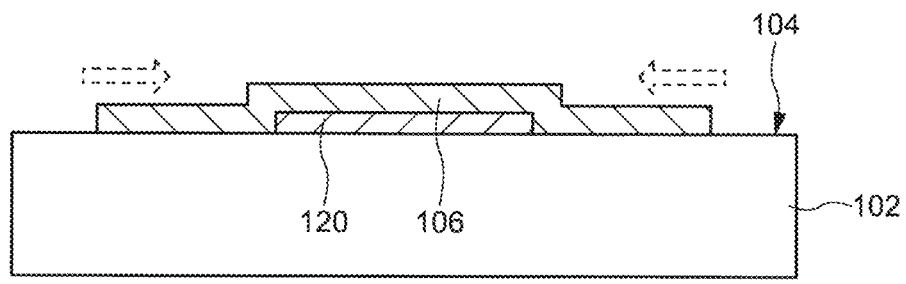
Figure 7D:
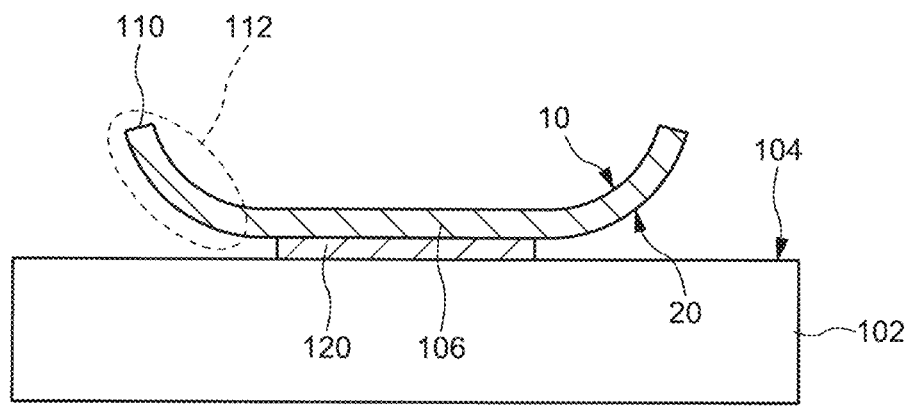

FIG. 7C shows the cooling process after heating of the first metal layer 106 and the second metal layer. During the cooling process, the first metal layer 106 and the second metal layer 120 act to return from the stretched state to the original state. With such a thermal history, as shown in FIG. 7D, the first metal layer 106 is shaped to peel off from the first end portion 110 to form the curved portion 112. On the other hand, the second metal layer 120, since the change due to heating is small, the phenomenon such as peeling does not appear, remains while maintaining the shape as it is.

In the present embodiment, two types of metal layers having different expansion coefficients are used as the metal layer serving as the pedestal metal of the LED chip 114a. Of the two metal layers, the first metal layer 106 having a large expansion coefficient is disposed on the upper layer side, the second metal layer 120 having a small expansion coefficient is disposed on the lower layer side. Furthermore, outer peripheral edge portion of the second metal layer 120 is disposed so as to be located inside outer peripheral edge portion of the first metal layer 106. By stacked structure of such two types of metal layers, it is possible to intentionally control the width of the curved portion 112 formed in the first metal layer 106. By heat-treating the first metal layer 106 and the second metal layer 120 provided as the pedestal of the LED chip 114a, the first metal layer 106 can be partially peeled off in a state in which the shape of the second metal layer 120 is maintained as it is, and the curved portion 112 that can be used as the light reflecting surface can be formed. According to the manufacturing process shown in this embodiment, it is only necessary to add the second metal layer 120, and no complicated steps or additional steps are required. In the heat treatment step, it is possible to form a first metal layer 106 having the curved portion 112 which can be used as a light reflecting surface only by controlling the heating and cooling. The size of the curved portion 112 can be adjusted by the sizes of the first metal layer 106 and the second metal layer 120. According to the present embodiment, the productivity of the LED module 100c having a high directivity of emitted light can be enhanced.

The LED module 100c according to the present embodiment can be implemented in combination with the configuration according to the third embodiment as appropriate. For example, by providing the liquid-repellent region 136 on a region other than region where the second metal layer 120 is in contact with the base surface 104, the first metal layer 106 can be more easily peeled off, and the curved portion 112 can be easily formed.

Seventh Embodiment

The present embodiment shows a display device having the configuration of the LED modules shown in the first embodiment, the third embodiment, and the fifth embodiment.

Figure 8:
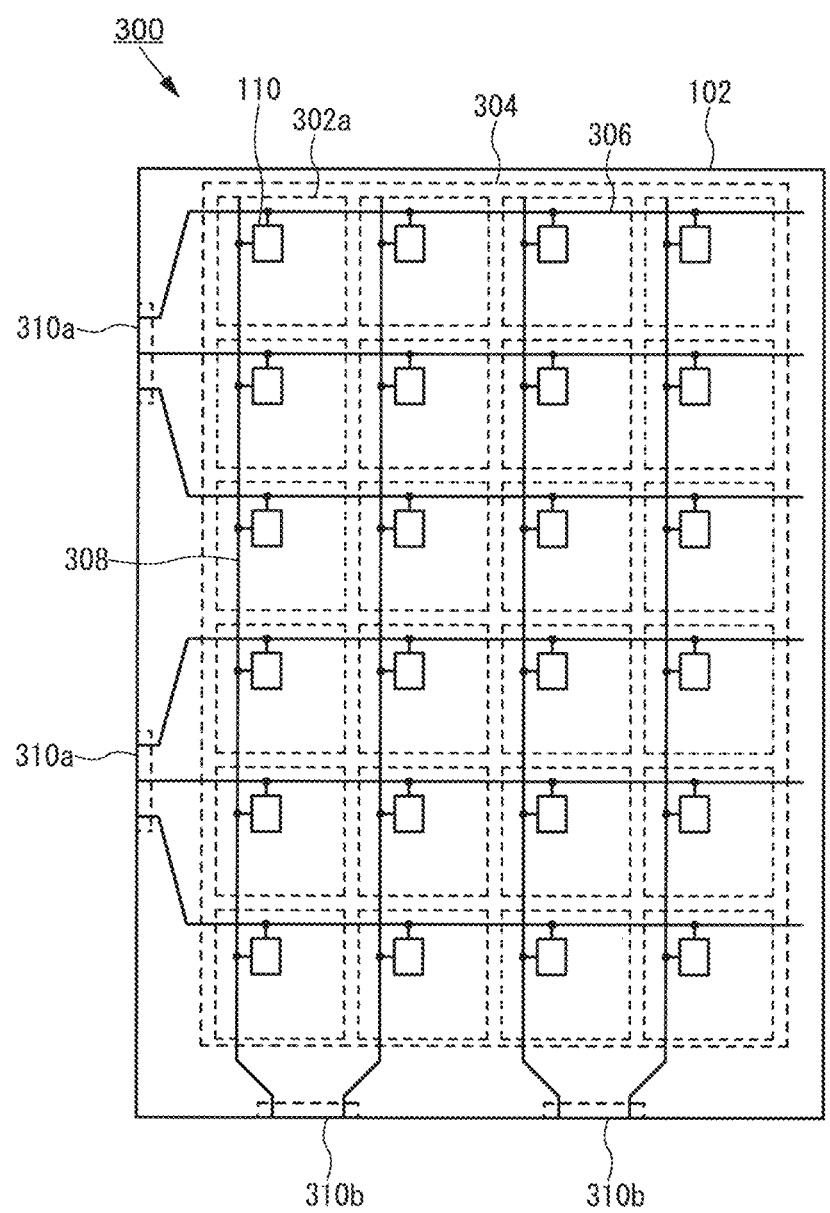
FIG. 8 shows the configuration of a display device according to an embodiment.

FIG. 8 shows a configuration of a display device 300 according to the present embodiment. The display device 300 has a display region 304 in which a plurality of pixels 302a are arranged in a matrix on the substrate 102. The display region 304 is provided with a scanning signal line 306 for inputting a scan signal to the pixel 302a and a data signal line 308 for inputting a video signal. The scanning signal line 306 and the data signal line 308 are arranged to intersect. An input terminal 310a of the scanning signal line 306 and an input terminal 310b of the data signal line 308 are provided at the periphery of the substrate 102. Although not illustrated in FIG. 8, a driver IC for driving the pixel 302a may be mounted on the substrate 102.

Figure 9:
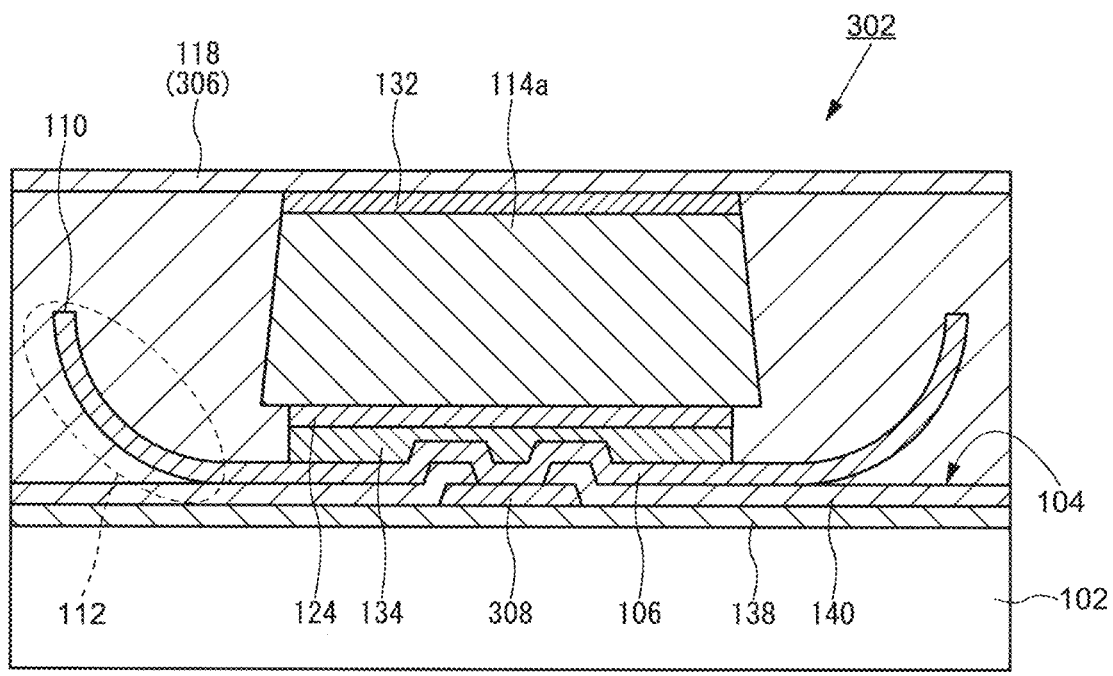
FIG. 9 shows cross-sectional view of a pixel in display device according to an embodiment of the present invention.

FIG. 9 shows an example of a cross-sectional structure of the pixel 302a. The pixel 302a has a structure in which a first insulating layer 138 and a second insulating layer 140 are stacked from the substrate 102, and a first metal layer 106 is provided on the base surface 104 formed of the second insulating layer 140. The scanning signal line 306 is formed by the transparent conductive layer 118 and the data signal line 308 is provided between the first insulating layer 138 and the second insulating layer 140. The first metal layer 106 is connected to the data signal line 308 through contact holes formed in the second insulating layer 140. The n-type side electrode 124 is electrically connected to the first metal layer 106 through the conductive member 134. The p-type side electrode 132 is electrically connected to the scanning signal line 306 formed by the transparent conductive layer 118.

The first metal layer 106 has the curved portion 112, and the height of the first end portion 110 is disposed between the lower surface and the upper surface t of the LED chip 114a. The LED chip 114a and the first metal layers 106 are embedded in the insulating layer 116, which is used as a planarization film. The configuration according to the third embodiment and the fifth embodiment can be applied to the LED chip and the first metal layer as the pedestal metal. Such the display device 300 can be manufactured by the processes shown in the second embodiment, the third embodiment, and the sixth embodiment.

According to the present embodiment, the individual pixel 302 of the display device 300, the LED chip 114, by the first metal layer 106 as a light reflecting surface is provided, the directivity of the light emitted or the pixel 302 can be enhanced in the front direction. Thus, the dynamic range of the display device 300 can be increased to enhance the image quality when viewing the display region 304 directly.

Although this embodiment illustrates an example in which passive matrix-type pixels are configured by the LED module, the present embodiment is not limited thereto, and can also be applied to an active matrix-type pixel in which the emission of individual pixels is controlled by a pixel circuit by a transistor.

What is claimed is:

1. An LED module, comprising:
   a first metal layer disposed on a base surface;
   an LED chip disposed on the first metal layer;
   the first metal layer includes a first end portion forming a contour away from the base surface, and a curved portion between a region overlapping the LED chip and the first end portion; and
   an insulating layer burying the first metal layer and the LED chip,
   wherein the first metal layer has a first surface facing the base surface and a second surface opposite to the first surface, the first surface and the second surface of the curved portion are in contact with the insulating layer.

2. The LED module according to claim 1, wherein the first metal layer is electrically connected to the LED chip.

3. The LED module according to claim 1, further comprising a transparent conductive layer disposed on the insulating layer,
   wherein the transparent conductive layer is electrically connected to the LED chip.

4. The LED module according to claim 1, wherein a height of the first end portion of the first metal layer is located between a lower surface and an upper surface of the LED chip.

5. The LED module according to claim 1, wherein the curved portion of the first metal layer forms a light reflecting surface.

6. The LED module according to claim 1, wherein the first metal layer has a rectangular shape in a plan view, and corners of the rectangular shape are cut inward.

7. The LED module according to claim 1, further comprising a second metal layer disposed between the base surface and the first metal layer,
   wherein the second metal layer has a second end portion that forms a contour, the second end portion is disposed inside the first end portion, and the curved portion is located between the first end portion and the second end portion.

8. The LED module according to claim 7, wherein the first metal layer is formed of a first metal material selected from at least one of aluminum, copper, and silver, and, the second metal layer is formed of a second metal material selected from at least one of titanium, molybdenum and tungsten.

9. A method for manufacturing LED module, the method comprising:
   forming a first metal layer having a first end portion forming a contour on a base surface;
   performing heat treatment on the first metal layer; and
   mounting an LED chip on the first metal layer,
   wherein the heat treatment forms a curved portion in the first metal layer, and the curved portion forms a shape in which the first end portion is away from the base surface, and
   wherein the heat treatment forms the height of the first end portion of the first metal layer between a lower s ace and an upper surface of the LED chip.

10. The method according to claim 9, wherein the heat treatment is performed by laser beam irradiation or flash lamp annealing.

11. The method according to claim 9, wherein the first metal layer is formed in a rectangular shape in a plan view and in a shape in which a corner part is cut inside.

12. The method according to claim 9, the method further comprising forming an insulating layer burying the first metal layer and the LED chip.

13. The method according to claim 12, the method further comprising forming a transparent conductive layer on the insulating layer.

14. The method according to claim 9, the method further comprising forming a second metal layer between the base surface and the first metal layer,
   wherein the second metal layer is formed so that a second end portion forming a contour is arranged inside the first end portion.

15. The method according to claim 14, wherein the heat treatment forms the curved portion of the first metal layer between the first end and the second end.

16. The method according to claim 14, wherein the first metal layer forming a first metal material selected from at least one of aluminum, copper, and silver and the second metal layer forming a second metal material selected from at least one of titanium, molybdenum and tungsten.

\* \* \* \* \*